Dec. 27, 1960 T. J. HUGHEL 2,966,033
REFRIGERATING APPARATUS
Filed Dec. 3, 1958

INVENTOR.
Thomas J. Hughel
BY Edwin S. Dybvig
His Attorney

United States Patent Office
2,966,033
Patented Dec. 27, 1960

2,966,033

REFRIGERATING APPARATUS

Thomas J. Hughel, Royal Oak, Mich., assignor to General Motors Corporation, Detroit, Mich., a corporation of Delaware Filed Dec. 3, 1958, Ser. No. 777,950

4 Claims. (Cl. 62—3)

This invention relates generally to refrigerating apparatus but especially pertains to thermoelectric systems for the production of heat and cold and also the generation of electric current by a supply of heat and cold.

The production of heat and cold directly from electrical currents as well as the production of electric current directly from heat and cold has intrigued inventors and scientists for many years, but the poor efficiency and limited capacity have caused mechanical refrigeration and mechanically driven generators to continue to be used.

It is an object of this invention to provide a thermoelectric system which is efficient enough and has sufficient capacity to be practical for the production of heat and cold directly from an electric current and in a reversal of functions to produce efficiently an electric current directly from heat and cold.

One of the reasons for the poor efficiency of the prior thermoelectric systems is the connection of the heat and cold conduction elements between the faces of the P and N members as in Patent 2,762,857, issued September 11, 1956. This arrangement is likely to contaminate the P and N members by foreign atoms from the soldering or brazing alloys and also causes contact resistance between the P and N members with a resultant $I^2R$ heat loss at the junction.

It is, therefore, another object of this invention to provide an efficient thermoelectric system in which a single crystal elongated semiconductor having alternate integral P and N sections and junctions is provided with an efficient arrangement for carrying heat to and removing heat from the alternate junctions in such a way that the efficiency and capacity of the junctions is not diminished for either heat transfer purposes or the production of electric curent.

These and other objects are attained in the two forms shown in the drawing in which a semiconductor of a crystal or crystalline structure of intermetallic compounds is grown under controlled conditions which result in alternate P and N sections with integral junctions or barriers. Attached to the crystal adjacent the P to N set of alternate (hot) junctions are circulating tubes cemented to the crystal at these alternate junctions by a cement or bonding agent having good electrical insulating properties and good heat transfer properties. The tubes are located at the bottom of a secondary circuit which extends upwardly to a heat dissipating condenser.

The N to P set of alternate (cold) junctions are also cemented by similar materials to tubes which form the upper portion of a secondary refrigerant circuit extending downwardly to a heat absorbing evaporator container located in heat transfer relation to a material to be cooled. An electrical circuit is connected to the N and P sections at the opposite ends of the crystal. A direct electric current is circulated through the crystal from the P section at the one end to the N section at the other end to cause the P to N junctions to be heated and the N to P junctions to be cooled to transfer heat from the heat absorbing evaporator to the heat dissipating condenser.

In a second form of the invention, a similar crystal or crystalline structure has solid metal conductors bonded by adhesives which are non-electrical conductors to the crystal and adjacent each junction. The conductors at the N to P junctions extend into heat transfer relationship with a source of heat such as the exhaust gases of an automobile engine. The P to N set of alternate junctions are bonded by non-electrical conducting bonding agents to conductors extending into heat transfer relationship with a cooling medium such as the flow of air. By thus heating and cooling the alternate junctions, the car battery, which supplies current for the starting motor and lighting system, will be charged during the normal operation of the automobile.

Further objects and advantages of the present invention will be apparent from the following description, reference being had to the accompanying drawings wherein prefered embodiments of the present invention are clearly shown.

Figures 1, 2, 3:
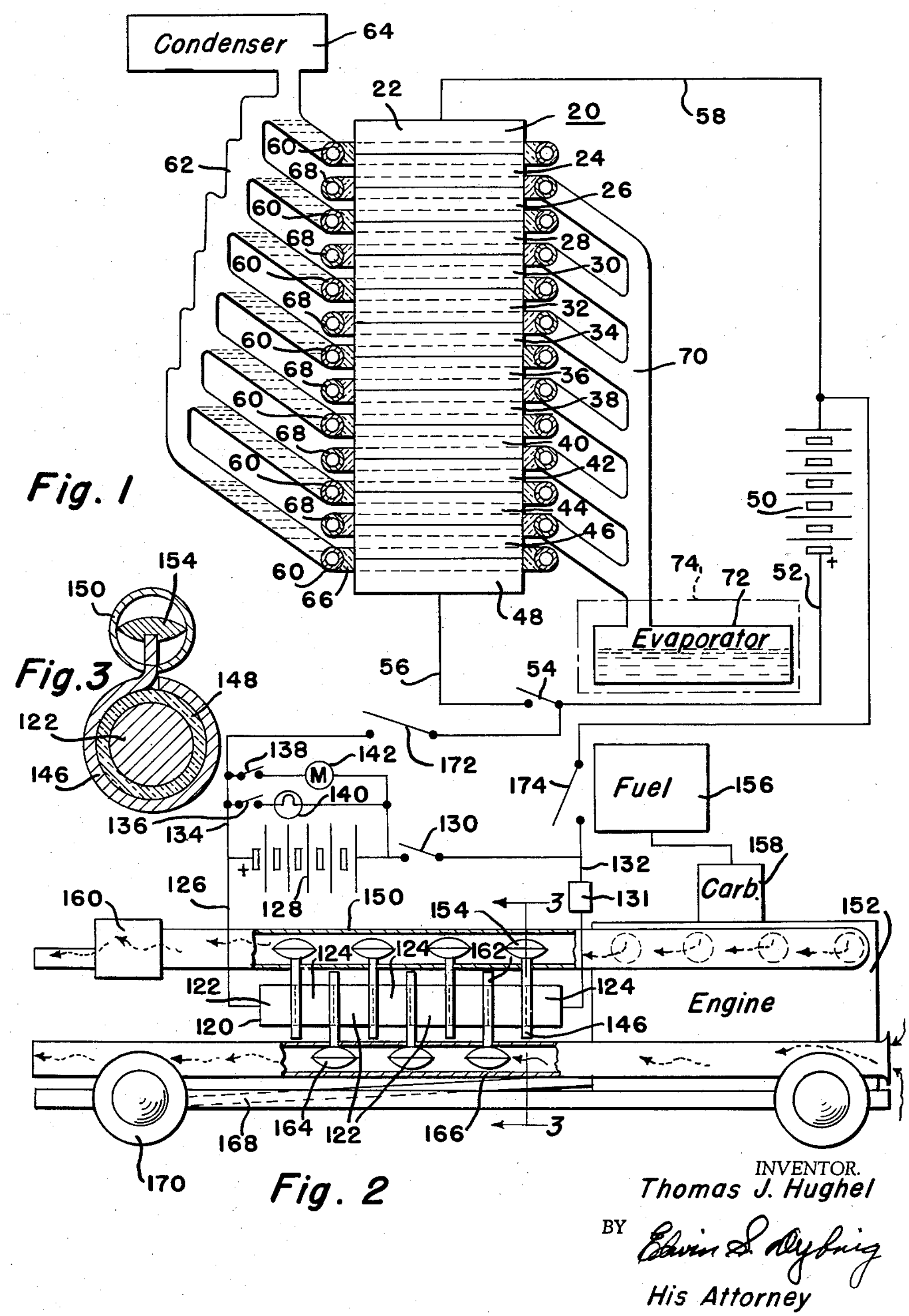
Figure 1 is a diagrammatic view of a thermoelectric refrigerating system embodying one form of my invention.
Figure 2 is a diagrammatic thermoelectric generating system for an automobile embodying another form of my invention.
Figure 3 is a sectional view taken along the line 3—3 of Figure 2.

Referring now more particularly to Figure 1, there is shown a single crystal semiconductor 20 or the equivalent having alternate N and P elements 22, 24, 26, 28, 30, 32, 34, 36, 38, 40, 42, 44, 46, and 48. This crystal 20 may be formed of any suitable semiconductor capable of forming integral joints or junctions between the P and N and N and P sections in a crystal or crystalline structure having good thermoelectric properties. Preferably, this is bismuth telluride ($Bi_2Te_3$), or lead telluride ($Pb_2Te_3$) in which the P sections 24, 28, 32, 36, 40, 44 and 48 are made with a deficiency of tellurium while the N type sections 22, 26, 30, 34, 38, 42 and 46 are made with an excess of tellurium. This crystal may be made either by the diffusion processes or by the crystal growth process. The crystal may also be made by changing the rate of crystal growth when both the P and N type impurities are present in the melt. Another process which may be used is to solidify the semiconductor under controlled vapor pressure of its more volatile constituent so that either the P or N type sections may be produced by varying the stoichiometric ratio on either side of ideal stoichiometry.

The P section 48 is connected to the positive terminal of a battery or D.C. generator 50 through the conductor 52, a switch 54, and the conductor 56. The opposite end terminal 22 is connected by the conductor 58 to the negative terminal of the battery or generator 50. The flow of current through the crystal 20 in this direction will cause the P to N junctions to heat while the N to P junctions will cool. To transfer this heat and cooling action to accomplish useful work, the P to N junctions are each surrounded by tubes 60 of a secondary heat transfer circuit 62 having its upper portion connected to the heat dissipating condenser 64 located in heat transfer relation with a medium at a lower temperature. The surrounding tubes 60 individually are bonded or cemented to the outer surface of the crystal immediately adjacent the P to N junctions by a suitable bonding agent or cement 66 such as mica or beryllium oxide. These bonding agents are good electrical insulators and good heat conductors. The distance between the tubes 60 and the surface of the crystal 20 should be no greater than necessary to provide adequate electrical insulation.

In a similar manner, the N to P junctions are surrounded with tubes 68 connected to a secondary heat transfer circuit 70 extending downwardly to a heat absorbing evaporator 72 located within an enclosure or medium 74 to be cooled. The tubes 68 individually are also bonded to the surface of the crystal 20 by a suitable bonding agent such as mica or beryllium oxide. The tubes 60 and their bonding agents of the secondary heat transfer system 62 are kept separate from and are spaced from the tubes 68 and the bonding agents of the secondary circuit 70. The secondary circuit 62 is provided with sufficient heat transfer liquid such as tetrafluorodichloroethane to fill all of the tubes 60 and their immediate connections. The heat transfer circuit 70 is provided with sufficient heat transfer fluid such as difluorodichloromethane to fill the majority of the space within the evaporator 72.

The flow of direct current through the crystal 20 provided by the battery or generator 50 will cause the P to N junctions to heat and be cooled by the volatile liquid in the tubes 60 which will evaporate and transfer the heat to the heat dissipating condenser which will recondense the vapor. The condensate will return by gravity to the tubes 60 in a continuous cycle. The N to P junctions will become cool and will condense in the tubes 68 vapors evaporated from the volatile liquid in the evaporator 72. This will cool the evaporator 72 and the compartment 74 and its contents. The condensed vapors will return from the tubes 68 to the evaporator 72 to be reevaporated in a continuous process. Instead of the gravity fluid system described, equivalent forced circulating systems may be used.

Figures 2 and 3 illustrate a reversal of function of the thermoelectric system employing a similar semiconductor crystal or crystalline structure. In this system, a similar semiconductor crystal or crystalline structure of the same type as specified in Figure 1 is employed. This semiconductor designated generally by the reference character 120 has alternate P sections 122, and alternate N sections 124 in a single conductor. The end P section is connected by the conductor 126 to the positive terminal of a storage battery 128. The negative terminal of the storage battery is connected by a switch 130 and a conductor 132 to the N section 124 at the opposite end of the crystal 120. The storage battery 128 is connected by the conductor 134, and the switches 136 and 138 respectively to the lighting circuit 140 and the starting motor 142 of an automobile.

The N to P junctions are surrounded by solid metal heat conductors 146 of copper or aluminum which are bonded and thermally connected to the surface of the semiconductor 120 at and adjacent these junctions by the electrical insulating heat conducting bonding agent 148 such as mica or beryllium oxide. The heat conducting metal 146 is extended into the exhaust pipe 150 of the driving engine 152 of an automobile or truck. Each metal conductor is provided with a streamlined heat absorbing terminal 154 for the purpose of absorbing heat from the exhaust from the engine 152. This engine is supplied a liquid hydrocarbon fuel from the fuel tank 156 through a suitable carburetor or fuel mixing device 158. The exhaust 150 may connect to a suitable muffler 160.

The alternate P to N junctions are provided with similar metal conductors 162 of copper or aluminum and connect to similar streamlined heat transfer members 164 similarly bonded by the same materials to the surface of the semiconductor at and immediately adjacent the N to P junctions. The bonding material and the conductors at each junction are spaced and separated from the corresponding material and conductors at the other junctions. These streamlined heat transfer members serve to dissipate heat to the air flowing through the tube 166 and extending from the front to the rear of the automobile. As the engine drives the car or truck through the propeller shaft 168 and the rear wheels 170, cool air flows through the tube 166 to cool the heat transfer members 164 and the conductor 162 as well as the N to P junctions while the exhaust gas from the engine 152 passing through the exhaust pipe 150 heats the heat absorbing elements and the metal conductors 146 to heat the N to P junctions. This causes a direct current flow through the semiconductor 120, the conductor 126, the battery 128, the switch 130 and the conductor 132 to keep the battery 128 charged during the operation of the vehicle. A cutout relay 131 is also provided.

If it is desired to cool an automobile or truck, the refrigerating system disclosed in Figure 1 may be connected to the electric generating system of Figure 2. For example, the conductor 52 may be connected by a switch 172 to the conductor 126 and the conductor 58 may be connected by a switch 174 to the conductor 132. In this combined system, the battery 50 would be eliminated.

Through this new type of semiconductor having integral N to P sections and conductors, I am able to efficiently use the thermoelectric system to function either as a direct refrigerating system or as an electric generator.

While the embodiments of the present invention as herein disclosed constitute preferred forms, it is to be understood that other forms might be adopted.

What is claimed is as follows:

1. A thermoelectric system comprising an elongated semiconductor in the form of a crystalline structure having a plurality of alternate N and P type sections with grown junctions, good heat conducting electrical insulating material in contact with the surface of said structure at and immediately adjacent the junctions between the N and P sections, the insulating material at the adjacent junctions being separate and discontinuous to minimize heat transfer between adjacent junctions, conducting means for conducting heat to the insulating material at each alternate junction, removing means separate from said conducting means for removing heat from the insulating material at the other set of alternate junctions, and an electrical circuit connected to the opposite end portions of said structure, and means for energizing said electrical circuit to cause heat to be absorbed from said means for conducting heat and to cause heat to be dissipated to said means for removing heat.

2. A thermoelectric system comprising an elongated semiconductor in the form of a crystalline structure having a plurality of alternate N and P sections with grown junctions between the sections, good heat conducting electrical insulating material in contact with the surface of said structure at and immediately adjacent the junctions between the N and P sections, the insulating material at the adjacent junctions being separate and discontinuous to minimize heat transfer between adjacent junctions, conducting means for conducting heat to the insulating material at each alternate junction, removing means separate from said conducting means for removing heat from the insulating material at the other set of alternate junctions, and an electrical circuit connected to the opposite end portions of said structure.

3. A thermoelectric system comprising an elongated semiconductor in the form of a crystalline structure containing as its principal constituent bismuth telluride having a plurality of alternate N and P type sections with grown junctions, first means in good heat transfer relationship with said crystalline structure at and imediately adjacent each alternate junction for conducting heat to said structure at each alternate junction, second means separate from said first means in good heat transfer relationship with said crystalline structure at and immediately adjacent each of the other alternate junctions for removing heat from said structure at said other alternate junctions, and an electrical circuit electrically connected to the opposite end portions of said structure.

4. A thermoelectric system comprising an elongated semiconductor in the form of a crystalline structure having a plurality of alternate N and P type sections with grown junctions, good heat conducting electrical insulating material bonded to the surface of said structure at and immediately adjacent said junctions, first fluid conduit means in good heat transfer relationship with and bonded to said insulating material at and immediately adjacent each alternate junction and containing a heat conducting medium for conducting heat to said structure at each alternate junction, second fluid conduit means thermally separate from said first means in good heat transfer relationship with and bonded to said insulating material at and immediately adjacent each of the other alternate junctions and containing a heat removing medium for removing heat from said structure at said other alternate junctions, and an electrical circuit electrically connected to the opposite end portions of said structure.

References Cited in the file of this patent

UNITED STATES PATENTS

| | | |
|---|---|---|
| 2,758,146 | Lindenblad | Aug. 7, 1956 |
| 2,798,989 | Welker | July 9, 1957 |
| 2,898,743 | Bradley | Aug. 11, 1959 |
| 2,932,953 | Becket | Apr. 19, 1960 |

FOREIGN PATENTS

| | | |
|---|---|---|
| 205,128 | Australia | Jan. 2, 1957 |